(12) United States Patent
Kumar et al.

(10) Patent No.: US 10,275,549 B2
(45) Date of Patent: Apr. 30, 2019

(54) ESTIMATING FROST MASS FORMED IN A DESIGN COMPONENT OF A MULTI-COMPONENT STRUCTURE

(71) Applicant: AIRBUS GROUP INDIA PRIVATE LIMITED, Bangalore (IN)

(72) Inventors: Sunil Kumar, Bangalore (IN); Madhusudhana Reddy, Bangalore (IN)

(73) Assignee: AIRBUS GROUP INDIA PRIVATE LIMITED, Bangalore, Karnataka (IN)

( * ) Notice: Subject to any disclaimer, the term of this patent is extended or adjusted under 35 U.S.C. 154(b) by 392 days.

(21) Appl. No.: 15/089,476

(22) Filed: Apr. 2, 2016

(65) Prior Publication Data

US 2016/0292327 A1 Oct. 6, 2016

(30) Foreign Application Priority Data

Apr. 3, 2015 (IN) .......................... 1783/CHE/2015

(51) Int. Cl.
 - *G06F 17/10* (2006.01)
 - *G06F 17/50* (2006.01)
 - *G06F 17/11* (2006.01)

(52) U.S. Cl.
 CPC .......... *G06F 17/5009* (2013.01); *G06F 17/11* (2013.01); *G06F 17/5018* (2013.01)

(58) Field of Classification Search
 None
 See application file for complete search history.

(56) References Cited

U.S. PATENT DOCUMENTS 9,546,004 B1 * 1/2017 Safai ...................... B64D 45/00

OTHER PUBLICATIONS

Luer et al. Frost Deposition in a Parallel Plate Channel Under Laminar Flow Conditions Int. J. Therm. Sci., 2000, 39 pp. 85-95.*
Robinson et al. A Study of Frost Formation on a Plain Fin University of Illinois at Urbana-Champaign, Aug. 2001.*
Ellgas et al. Modeling Frost Formation Within a Commercial 3-d CFD Code Numerical Heat Transfer, Part A, 53: pp. 485-506, 2008.*
Prolss et al. Modeling of Frost Growth on Heat Exchanger Surfaces Modelica Association, Modelica 2006, Sep. 4-5.*
Silva et al. Numerical Prediction of Frost Thickness Growth Over a Cold Cylinder 4th International Congress on University-Industry Cooperation, Dec. 5, 2012.*
Cheikh et al. Frost Growth on Vertical Surfaces with Varying Wettability Purdue University, Purdue e-Pubs, International Regrigeration and Air Conditioning Conference (Year: 2012).*
Li et al. Frosting Performance Dynamic Simulation and Analysis on Freeze Dryer Vapor Captor 2010 Third International Conference on Information and Computing (Year: 2010).*

* cited by examiner

*Primary Examiner* — Rehana Perveen
*Assistant Examiner* — Cuong V Luu
(74) *Attorney, Agent, or Firm* — Prakash Nama; Global IP Services, PLLC (57) ABSTRACT

A system and method for estimating frost mass formed in a design component of a multi-component structure are disclosed. In one embodiment, the frost mass formed in the design component is iteratively estimated using a heat transfer rate at an interface between fluid and a frost layer in the design component, a height of the frost layer and a density of the frost layer.

25 Claims, 5 Drawing Sheets

ESTIMATING FROST MASS FORMED IN A DESIGN COMPONENT OF A MULTI-COMPONENT STRUCTURE

RELATED APPLICATIONS

Benefit is claimed under 35 U.S.C. 119(a)-(d) to Foreign application Serial No. 1783/CHE/2015 filed in India entitled "ESTIMATING FROST MASS FORMED IN A DESIGN COMPONENT OF A MULTI-COMPONENT STRUCTURE", filed on Apr. 3, 2015, by AIRBUS GROUP INDIA PRIVATE LIMITED, which is herein incorporated in its entirety by reference for all purposes.

TECHNICAL FIELD

Embodiments of the present subject matter generally relate to frost formed in a design component of a multi-component structure, and more particularly, to estimating frost mass formed in the design component of the multi-component structure.

BACKGROUND

Typically, during operation a design component of a multi-component structure encounter humid air and the humid air may condense due to surrounding low temperatures. This can result in forming frost in and around the design component. Example multi-component structure is a vehicle, an air conditioning system and so on. Exemplary vehicle is an aircraft, an automobile and the like. The design component may be a duct or a bend having uniform or non-uniform cross sections. Generally, ambient air may come and go out of an aircraft cabin based on ventilation systems and passenger comfort needs. When humid ambient air gets stagnated in insulation near an aircraft door, humidity in the air may condense on cold walls of design components in the aircraft door, forming frost in and around the design components. The accumulated frost can substantially increase the weight of the aircraft which may result in increasing fuel consumption.

SUMMARY

A system and method for estimating frost mass formed in a design component of a multi-component structure are disclosed. According to one aspect of the present subject matter, the frost mass formed in the design component is iteratively estimated using a heat transfer rate at an interface between fluid and a frost layer in the design component, a height of the frost layer and a density of the frost layer.

According to another aspect of the present subject matter, the system includes a processor and a memory coupled to the processor. Further, the memory includes a frost modeling tool. In one embodiment, the frost modeling tool iteratively estimates frost mass formed in the design component using a heat transfer rate at an interface between fluid and a frost layer in the design component, a height of the frost layer and a density of the frost layer.

According to yet another aspect of the present subject matter, a non-transitory computer-readable storage medium of estimating frost mass formed in a design component of a multi-component structure, having instructions that, when executed by a computing system causes the computing system to perform the method described above.

The system and method disclosed herein may be implemented in any means for achieving various aspects. Other features will be apparent from the accompanying drawings and from the detailed description that follow.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

Embodiments described herein provide methods, techniques, and systems for estimating frost mass formed in a design component of a multi-component structure. For example, the multi-component structure includes a vehicle (e.g., an aircraft, an automobile and the like), an air conditioning system and so on. The design component may include ducts or bends with uniform or non-uniform cross-sectional areas. The example technique iteratively estimates the frost mass formed in the design component using a heat transfer rate at an interface between fluid and a frost layer in the design component, a height of the frost layer and a density of the frost layer.

Figure 1:
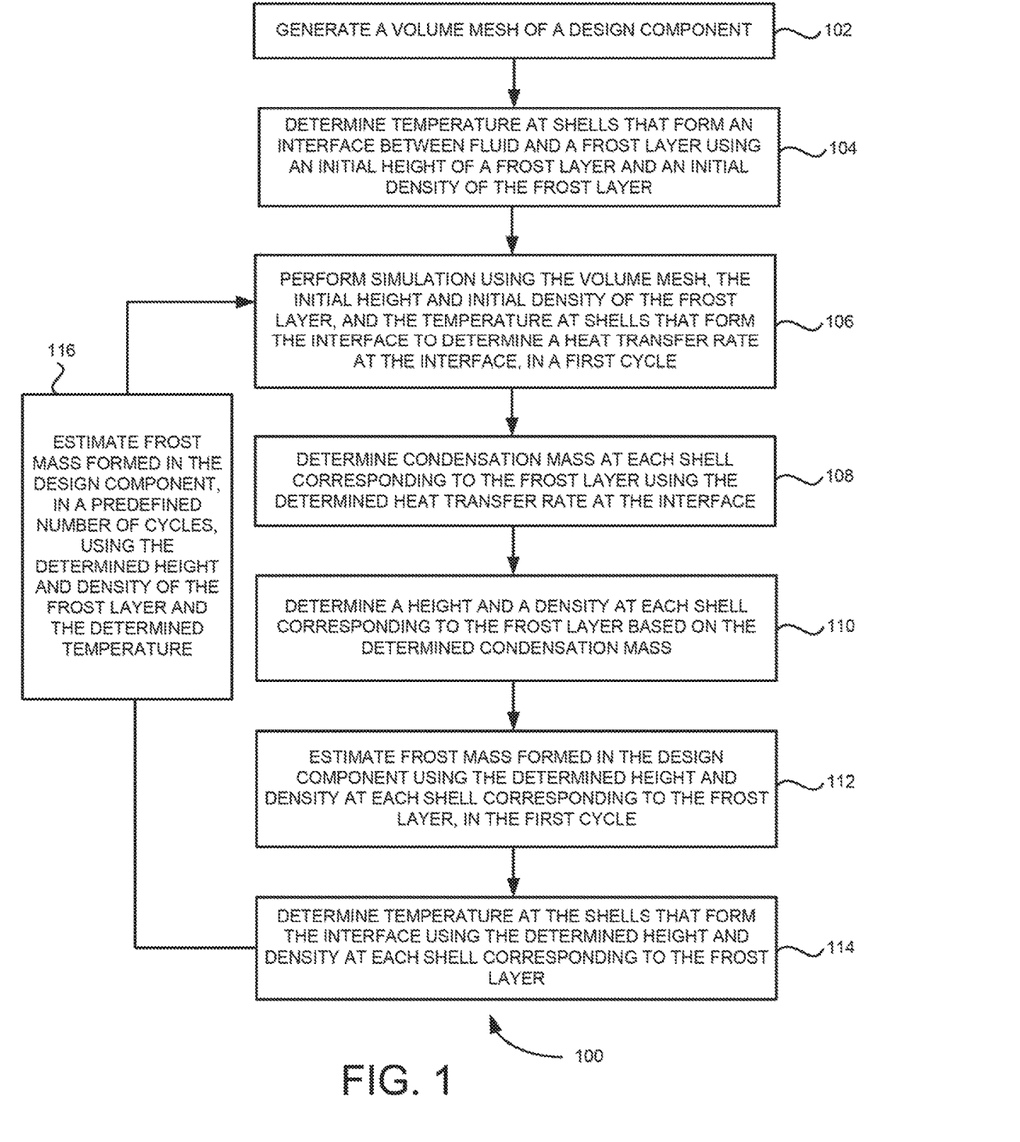
FIG. 1 is a flow diagram illustrating a method for estimating frost mass formed in a design component of a multi-component structure, according to one embodiment.

FIG. 1 is a flow diagram 100 illustrating a method for estimating frost mass formed in a design component of a multi-component structure, according to one embodiment. For example, the multi-component structure includes a vehicle (e.g., an aircraft, an automobile and the like), an air conditioning system and so on. The design component may include ducts or bends having uniform or non-uniform cross-sectional areas in a cold environment. At block 102, a volume mesh of the design component is generated. The volume mesh may include cells of various shapes, such as tetrahedral, hexahedral, pyramid and the like in the volume and shells at boundaries and interfaces. At block 104, temperature at shells that form an interface between fluid and a frost layer in the design component is determined using an initial height of a frost layer, an initial density of the frost layer and/or a thermal conductivity. For example, the interface is on top of the frost layer which is seen by fluid. The thermal conductivity ($k_f$) may be determined using the density of the frost layer. For example, the initial height and the initial density of the frost layer are a height and density of the frost layer when the frost mass estimation process is started. At block 106, simulation is performed using the volume mesh, the initial height of the frost layer, the initial density of the frost layer, and the temperature at shells that form the interface, determined at the block 104, to determine a heat transfer rate at the interface, in a first cycle. The first cycle can be a first cycle after the frost mass estimation process is started.

At block 108, condensation mass at each shell corresponding to the frost layer is determined using the determined heat transfer rate at the interface. In an example implementation, a condensation rate at each shell corresponding to the frost layer is determined using the determined heat transfer rate at the interface and then the condensation mass at each shell corresponding to the frost layer is determined using the condensation rate. In this example implementation, the condensation rate is governed by a rate of diffusion of water vapour towards a cold surface of the design component. For example, the condensation mass can be represented through a mass (continuity) source term in near-cell wall as shown in below equation:

$$\dot{m}''' = \rho v \frac{A_{cellwall}}{V_{cell}} \quad (1)$$

wherein,
$\dot{m}'''$=a total condensation rate per unit volume at a wall face,
$\rho$=a density of fluid adjacent to the wall,
$v$=a velocity of the fluid,
$A_{cellwell}$=an area of the wall face, and
$V_{cell}$=a volume of a cell.

At block 110, a height and density at each shell corresponding to the frost layer, in the first cycle, are determined based on the determined condensation mass. In an example implementation, a change in the initial height and initial density at each shell corresponding to the frost layer is computed based on the determined condensation mass. This is explained in more detail with reference to FIG. 2. Further, a first height and a first density at each shell corresponding to the frost layer are computed by adding the computed change to the initial height and initial density of the frost layer, respectively. In some embodiments, the first height and first density at each shell corresponding to the frost layer are updated based on a predetermined height of the frost layer. For example, the predetermined height of the frost layer is based on geometrical constraints of the design component. The geometrical constraints may include a shortest distance to near wall from each shell corresponding to the frost layer, inlet parameters, outlet parameters and the like of the design component. This is explained in more detailed with reference to FIG. 3. In these embodiments, the first height and first density at each shell corresponding to the frost layer is updated to a second height and a second density at each shell corresponding to the frost layer, respectively, when the first height is greater than the predetermined height. The second height of the frost layer is less than the first height of the frost layer and less than or equal to the predetermined height. The second density of the frost layer is greater than the first density of the frost layer. In an example, a first height of the frost layer is 2 mm, a first density of the frost layer is 0.6 kg/m³ and the predetermined height is 1.5 mm. In this example, the first height is greater than the predetermined height. Therefore, the first height is updated to a second height (1 mm) which is less than the predetermined height and the first height. The first density is also updated to a second density (0.9 kg/m³) which is greater than the first density.

At block 112, frost mass formed on the shells in the design component is estimated using the determined or updated height and density at each shell corresponding to the frost layer, in the first cycle. At block 114, temperature at the shells that form the interface is determined using the determined or updated height and density at each shell corresponding to the frost layer. At block 116, the process steps from the block 106 to block 114 are repeated for estimating frost mass formed in a predefined number of cycles using the determined or updated height and density of the frost layer and the temperature at the interface which is determined at the block 114. If the frost mass is estimated during a design phase or manufacturing of the structure, then design of the structure is changed such that the frost formation is reduced. If the frost mass is estimated after design and before use of the structure (i.e., before flight in case of an aircraft), then the structure is sent for maintenance (i.e., cleaning) or a ventilation system is changed to maintain efficiency of the structure.

Figure 2:
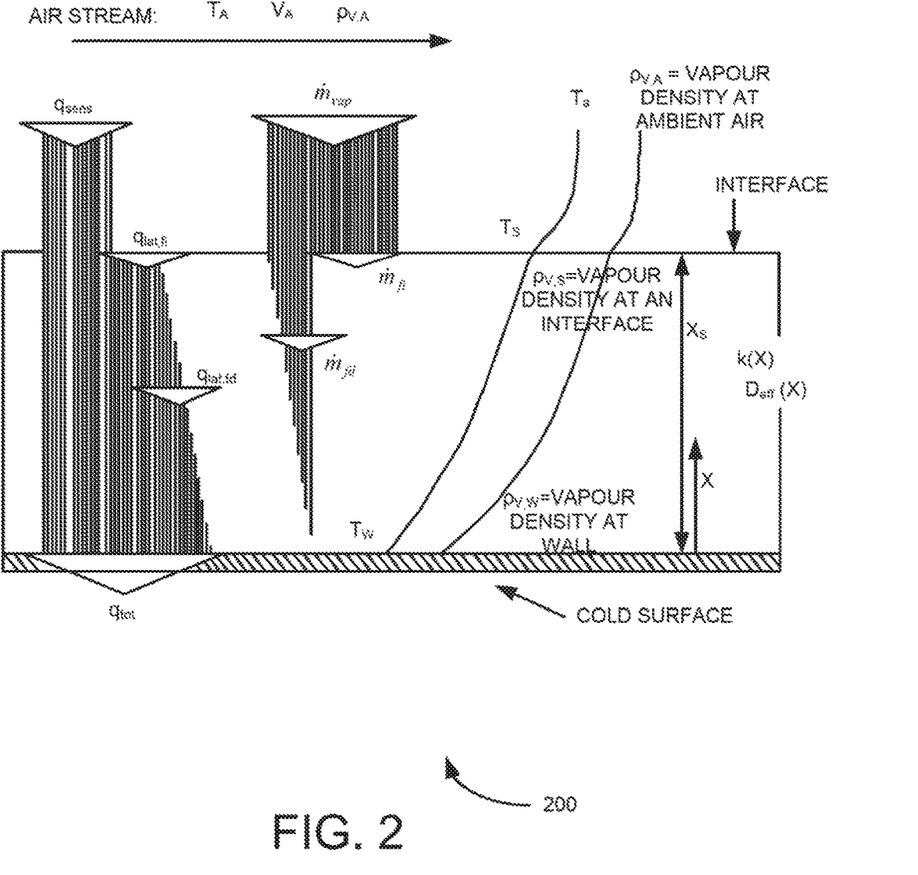
FIG. 2 is a schematic diagram illustrating splitting of condensation mass at each shell corresponding to a frost layer in a design component as a height and density of the frost layer, according to one embodiment.

Referring now to FIG. 2, which is a schematic diagram 200 illustrating splitting of condensation mass at each shell corresponding to a frost layer in a design component as a height and density of the frost layer, according to one embodiment. As shown in FIG. 2, the condensed mass or a total condensation rate per unit volume at a wall face ($\dot{m}'''$), shown in equation (1), at an interface is divided into two parts. One part ($\dot{m}_{fd}$) of the condensation mass enters inside porous of the frost layer and increases the density of the frost layer. The other part ($\dot{m}_{fi}$) of the condensed mass accumulates at the interface and increases the height of the frost layer. The condensation mass ($\dot{m}'''$) is divided into $\dot{m}_{fd}$ and $\dot{m}_{fi}$ as shown in a below example equation (2):

$$\dot{m}''' = \dot{m}_{vap} = \dot{m}_{fd} + \dot{m}_{fi} = \frac{\partial \rho_f}{\partial t} X_s + \frac{\partial X_s}{\partial t} \rho_f \quad (2)$$

$$\dot{m}_{fd} = F_{vap} \cdot \left[\frac{\partial T}{\partial X}\right]_{X=X_s}$$

$$F_{vap} = \frac{D_{eff} M_V}{RT_S} \left| \left[\frac{\partial P_V}{\partial T}\right]_{X=X_s} - \frac{P_V(T_S)}{T_S} \right|$$

$$\left[\frac{\partial T}{\partial X}\right]_{X=X_s} = \frac{h_H(T_a - T_S) + H_S \dot{m}_{vap}}{k_f + H_S F_{vap}} = \frac{q_{tot}}{k_f + H_S F_{vap}}$$

$$k_f = 1.202 \cdot 10^{-3} \rho_f^{0.963}$$

$$D_{eff} = \frac{(1 - (\rho_f / \rho_{ice}))}{(1 + (\rho_f / \rho_{ice})^{0.5})} D_S$$

or $$D_{eff} = \frac{(1 - (\rho_f / \rho_{ice}))}{(1 - 0.58 \cdot (\rho_f / \rho_{ice}))} D_S$$

wherein,
$\rho_f$=a density of the frost layer,
$\rho_{ice}$=a density of ice or a solid medium, $X_s$=a height of the frost layer,
$k_f$=a thermal conductivity or frost conductivity,
$F_{vap}$=a frost densification factor,
$D_{eff}$=a molecular diffusivity,
$T_S$=a temperature at the interface,
R=a universal gas constant,
$M_v$=molecular mass,
$P_v$=a vaporization pressure,
$H_S$=Heat of sublimation,
$T_a$=an atmospheric temperature,
$h_H$=a heat transfer co-efficient, and
$q_{tot}$=total heat.

Further, changes in the density and height of the frost layer are obtained using below equations, respectively:

$$\Delta \rho_f = \frac{\dot{m}_{fd}}{X_s} \Delta t$$

$$\Delta X_s = \frac{(\dot{m}_{vap} - \dot{m}_{fd})}{\rho_f} \Delta t$$

Furthermore, a heat transfer rate at the interface is determined using below equations:

$$q_{sens} + q_{lat} = q_{cond}$$

$$h_H(T_a - T_S) + H_S \dot{m}_{vap} = K_{solid} \nabla T_S$$

wherein,
$q_{sens}$=sensible heat,
$q_{lat}$=latent heat,
$q_{cond}$=conduction heat, and
$K_{solid}$=a conductivity of a solid medium.

Figure 3:
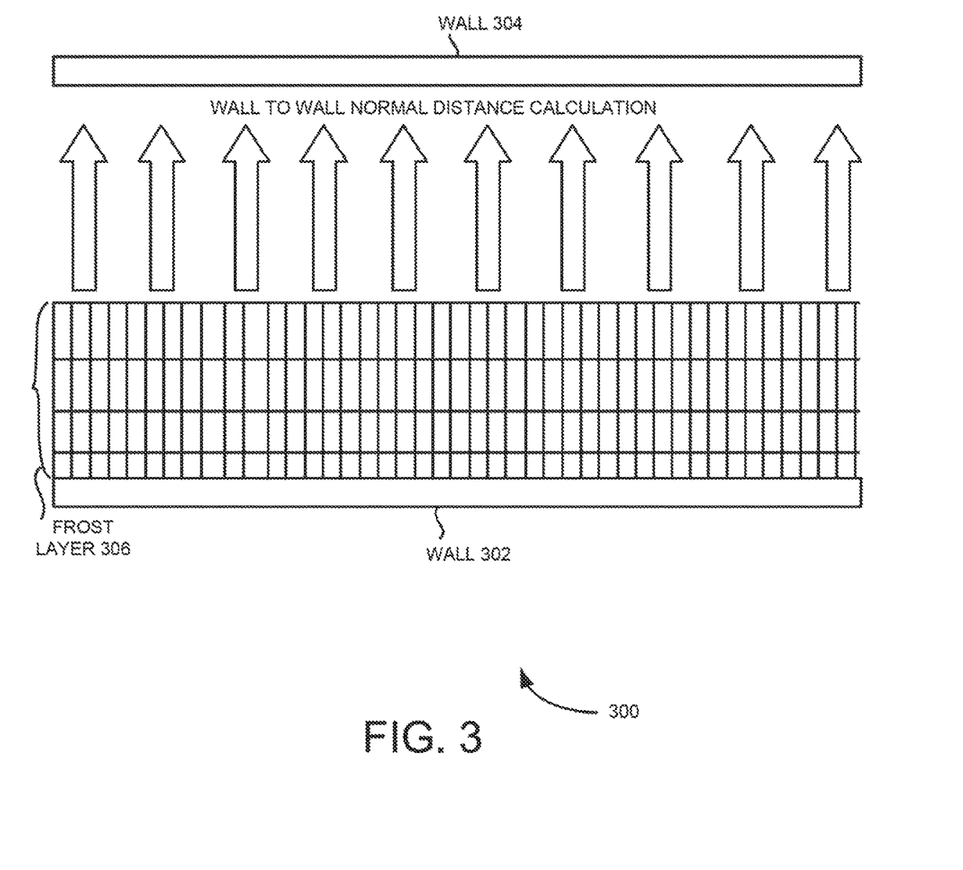
FIG. 3 is a schematic diagram illustrating determination of a predetermined height at each shell on a cold surface of a design component, according to one embodiment.

Referring now to FIG. 3, which is a schematic diagram 300 illustrating determination of a predetermined frost height at each shell on a cold surface of a design component, according to one embodiment. More particularly, FIG. 3 depicts geometrical constraints imposed on the frost height i.e., the frost height cannot exceed a gap between walls (i.e., boundary walls) 302 and 304. In an example, the predetermined height is determined by calculating distance between the two walls 302 and 304 of the design component in a normal direction. In this example, the normal distance is calculated between a given face of the wall 302 and a face of the wall 304 in the normal direction. The shortest distance to near wall is to be considered as the predetermined height available for the frost to grow and is stored in a user defined memory location for restricting height of a frost layer 306.

Figure 4:
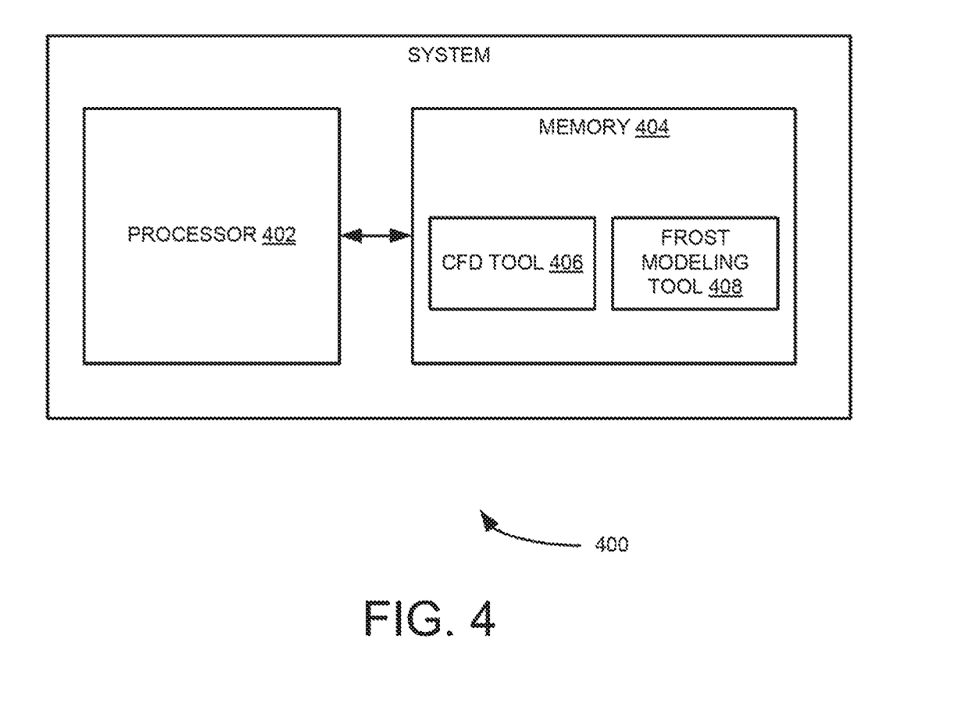
FIG. 4 illustrates a block diagram of a system for estimating frost mass formed in a design component of a multi-component structure, using the process described with reference to FIG. 1, according to one embodiment.

Referring now to FIG. 4, which illustrates a block diagram of a system 400 for estimating frost mass formed in a design component of a multi-component structure, using the process described with reference to FIG. 1, according to one embodiment. As shown in FIG. 4, the system 400 includes a processor 402 and a memory 404 communicatively coupled to the processor 402. Further, the memory 404 includes a computational fluid dynamics (CFD) tool 406 and a frost modeling tool 408.

In one embodiment, the CFD tool 406 generates a volume mesh of the design component. Further, the CFD tool 406 determines temperature at shells, in the volume mesh, that form an interface between fluid and a frost layer in the design component. The CFD tool 406 then performs simulation using the volume mesh, an initial height of the frost layer, an initial density of the frost layer, and the temperature at shells that form the interface to determine a heat transfer rate at the interface, in a first cycle. Furthermore, the CFD tool 406 determines condensation mass at each shell corresponding to the frost layer using the determined heat transfer rate at the interface. The frost modeling tool 408 then determines a height and a density at each shell corresponding to the frost layer, in the first cycle, based on the determined condensation mass. In addition, the frost modeling tool 408 estimates frost mass formed in the design component using the determined height and density at each shell corresponding to the frost layer, in the first cycle.

Moreover, the frost modeling tool 408 determines temperature at the shells that form the interface using the determined height and density at each shell corresponding to the frost layer. Further, the CFD tool 406 repeats the steps of performing simulation and determining condensation mass using the determined height of the frost layer and density of the frost layer and the temperature at the interface for a next cycle. The frost modeling tool 408 repeats the steps of determining a height and density of the frost layer and estimating frost mass in the design component based on the condensation mass in the next cycle. This is explained in more detail with reference to FIG. 1.

Figure 5:
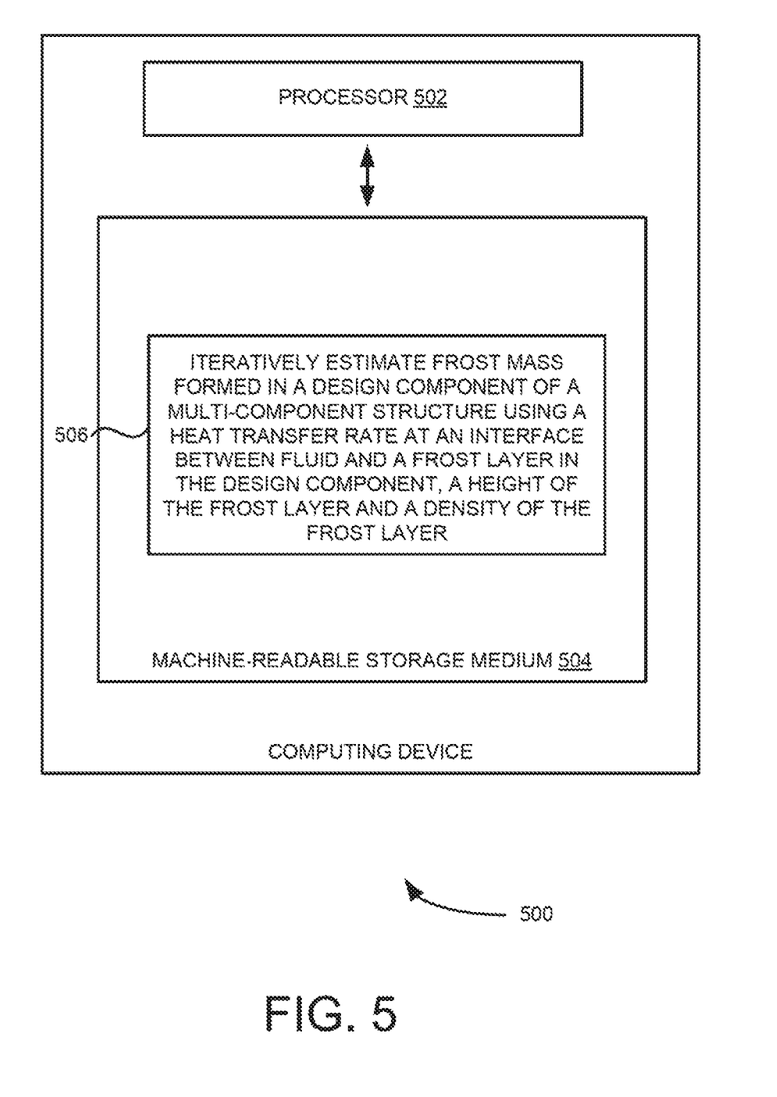
FIG. 5 illustrates a block diagram of a computing device for estimating frost mass formed in a design component of a multi-component structure, using the process described with reference to FIG. 1, according to one embodiment.

FIG. 5 illustrates a block diagram of a computing device 500 for estimating frost mass formed in a design component of a multi-component structure, using the process described with reference to FIG. 1, according to one embodiment. The computing device 500 includes a processor 502 and a machine-readable storage medium 504 communicatively coupled through a system bus. The processor 502 may be any type of central processing unit (CPU), microprocessor, or processing logic that interprets and executes machine-readable instructions stored in the machine-readable storage medium 504. The machine-readable storage medium 504 may be a random access memory (RAM) or another type of dynamic storage device that may store information and machine-readable instructions that may be executed by the processor 502. For example, the machine-readable storage medium 504 may be synchronous DRAM (SDRAM), double data rate (DDR), rambus DRAM (RDRAM), rambus RAM, etc., or storage memory media such as a floppy disk, a hard disk, a CD-ROM, a DVD, a pen drive, and the like. In an example, the machine-readable storage medium 504 may be a non-transitory machine-readable storage medium. In an example, the machine-readable storage medium 504 may be remote but accessible to the computing device 500.

The machine-readable storage medium 504 may store instructions 506. In an example, instructions 506 may be executed by processor 502 to iteratively estimate the frost mass formed in the design component using a heat transfer rate at an interface between fluid and a frost layer in the design component, a height of the frost layer and a density of the frost layer.

For the purpose of simplicity of explanation, the example method of FIG. 1 is shown as executing serially, however it is to be understood and appreciated that the present and other examples are not limited by the illustrated order. The example systems of FIGS. 4 and 5, and method of FIG. 1 may be implemented in the form of a computer program product including computer-executable instructions, such as program code, which may be run on any suitable computing device in conjunction with a suitable OS. Examples within the scope of the present disclosure may also include program products comprising non-transitory computer-readable storage media for carrying or having computer-executable instructions or data structures stored thereon. Such computer-readable media can be any available media that can be accessed by a general purpose or special purpose computer. By way of example, such computer-readable media can comprise RAM, ROM, EPROM, EEPROM, CD-ROM, magnetic disk storage or other storage devices, or any other medium which can be used to carry or store desired program code in the form of computer-executable instructions and which can be accessed by a general purpose or special purpose computer. The computer readable instructions can also be accessed from memory and executed by a processor.

In the various embodiments, the system and method described in FIGS. 1 through 5 propose a technique to estimate frost mass formed on a cold surface of a design component in a multi-component structure. In this technique, condensation mass on the cold surface of the design component is determined and then height, density and thermal conductivity of the frost layer (i.e., frost parameters) are determined using the condensation mass in a first cycle. With the frost parameters, a heat transfer rate can be determined and applied back to determine the frost parameters in next cycles. Such inclusion of the frost parameters for determining the condensation mass increases accuracy of the frost mass estimation. Further in this technique, a geometrical constraint is used to limit unphysical values of frost parameters as growth of the frost layer height may not have any impact on flow field.

Although certain methods, systems, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

What is claimed is:

1. A method comprising:
iteratively estimating the frost mass formed in the design component using a heat transfer rate at an interface between fluid and a frost layer in the design component, a height of the frost layer and a density of the frost layer, wherein iteratively estimating the frost mass formed in the design component comprises:
generating a volume mesh of the design component;
determining temperature at shells, in the volume mesh, that form the interface;
performing simulation using: the volume mesh, an initial height of the frost layer, an initial density of the frost layer, and the temperature at shells that form the interface, in order to determine the heat transfer rate at the interface, in a first cycle;
determining condensation mass at each shell corresponding to the frost layer using the determined heat transfer rate at the interface; and
determining a height and density at each shell corresponding to the frost layer based on the determined condensation mass, in the first cycle, wherein determining the height and density at each shell corresponding to the frost layer based on the determined condensation mass, comprises:
computing a change in the initial height and initial density at each shell corresponding to the frost layer based on the determined condensation mass; and
determining a first height and a first density at each shell corresponding to the frost layer by adding the computed change to the initial height and initial density of the frost layer, respectively;
designing the component to reduce the frost mass formation or removing the frost mass formed on the designed component based on the determined height and density at each shell corresponding to the frost layer; and
manufacturing the design component in accordance with the designing of the component.

2. The method of claim 1, wherein iteratively estimating the frost mass formed in the design component using the heat transfer rate at the interface, the height of the frost layer and the density of the frost layer, comprising:
estimating frost mass formed in the design component using the determined height and density at each shell corresponding to the frost layer, in the first cycle.

3. The method of claim 2, further comprising:
determining temperature at the shells that form the interface using the determined height and density at each shell corresponding to the frost layer.

4. The method of claim 3, further comprising:
repeating the steps of performing simulation, determining condensation mass, determining a height and density of the frost layer and estimating frost mass formed in the design component for a predefined number of cycles using the determined height and density of the frost layer and the temperature at the shells that form the interface.

5. A method comprising:
iteratively estimating the frost mass formed in the design component using a heat transfer rate at an interface between fluid and a frost layer in the design component, a height of the frost layer and a density of the frost layer, wherein iteratively estimating the frost mass formed in the design component comprises:
generating a volume mesh of the design component;
determining temperature at shells, in the volume mesh, that form the interface;
performing simulation using: the volume mesh, an initial height of the frost layer, an initial density of the frost layer, and the temperature at shells that form the interface, in order to determine the heat transfer rate at the interface, in a first cycle;
determining condensation mass at each shell corresponding to the frost layer using the determined heat transfer rate at the interface;
determining a height and density at each shell corresponding to the frost layer based on the determined condensation mass, in the first cycle, wherein determining the height and density at each shell corresponding to the frost layer based on the determined condensation mass, comprises:
computing a change in the initial height and initial density at each shell corresponding to the frost layer based on the determined condensation mass;
determining a first height and a first density at each shell corresponding to the frost layer by adding the computed change to the initial height and initial density of the frost layer, respectively; and
updating the determined first height and first density at each shell corresponding to the frost layer based on a predetermined height of the frost layer; and
estimating frost mass formed in the design component using the determined height and density at each shell corresponding to the frost layer, in the first cycle;
designing the component to reduce the frost mass formation or removing the frost mass formed on the designed component based on the estimated frost mass; and
manufacturing the design component in accordance with the designing of the component.

6. The method of claim 5, wherein updating the determined first height and first density at each shell corresponding to the frost layer based on the predetermined height of the frost layer, comprises:

updating the determined first height and first density at each shell corresponding to the frost layer to a second height and second density at each shell corresponding to the frost layer, respectively, when the first height is greater than the predetermined height, wherein the second height of the frost layer is less than the first height of the frost layer and the second density of the frost layer is greater than the first density of the frost layer.

7. The method of claim 5, wherein the predetermined height of the frost layer is based on geometrical constraints of the design component and wherein the geometrical constraints comprise a shortest distance to near wall from each shell corresponding to the frost layer, inlet parameters of the design component and/or outlet parameters of the design component.

8. The method of claim 1, wherein the multi-component structure comprises a vehicle or an air conditioning system and wherein the design component comprises ducts or bends with uniform or non-uniform cross-sectional areas.

9. A system, comprising:
a processor; and
a memory coupled to the processor, wherein the memory comprises:
  a computational fluid dynamics (CFD) tool to:
    generate a volume mesh of a design component;
    determine temperature at shells, in the volume mesh, that form an interface;
    perform simulation using: the volume mesh, an initial height of a frost layer, an initial density of the frost layer, and the temperature at shells that form the interface, in order to determine a heat transfer rate at the interface, in a first cycle; and
    determine condensation mass at each shell corresponding to the frost layer using the determined heat transfer rate at the interface; and
  a frost modeling tool to:
    iteratively estimate frost mass formed in the design component of a multi-component structure using the heat transfer rate at the interface between fluid and a frost layer inside the design component, a height of the frost layer and a density of the frost layer; and
    determine a height and density at each shell corresponding to the frost layer based on the determined condensation mass, in the first cycle, wherein to determine the height and density at each shell corresponding to the frost layer, the frost modelling tool is configured to:
      compute a change in the initial height and initial density at each shell corresponding to the frost layer based on the determined condensation mass; and
      compute a first height and a first density at each shell corresponding to the frost layer by adding the computed change to the initial height and initial density of the frost layer, respectively, wherein the component is designed to reduce the frost mass formed or removing the frost mass formed on the designed component based on the determined height and density at each shell corresponding to the frost layer, and wherein the design component is manufactured in accordance with the designing of the component.

10. The system of claim 9, wherein the frost modeling tool is configured to:
estimate frost mass formed in the design component using the determined height and density at each shell corresponding to the frost layer, in the first cycle.

11. The system of claim 10, wherein the frost modeling tool is further configured to:
determine temperature at the shells that form the interface using the determined height and density at each shell corresponding to the frost layer.

12. The system of claim 11, wherein the CFD tool is further configured to:
repeat the steps of performing simulation and determining condensation mass at each shell corresponding to the frost layer using the determined heat transfer rate at the interface for a next cycle.

13. The system of claim 12, wherein the frost modeling tool is further configured to:
repeat the steps of determining a height and density of the frost layer and estimating frost mass formed in the design component based on the determined condensation mass in the next cycle.

14. A system, comprising:
a processor; and
a memory coupled to the processor, wherein the memory comprises:
  a computational fluid dynamics (CFD) tool to:
    generate a volume mesh of a design component;
    determine temperature at shells, in the volume mesh, that form an interface;
    perform simulation using: the volume mesh, an initial height of a frost layer, an initial density of the frost layer, and the temperature at shells that form the interface, in order to determine a heat transfer rate at the interface, in a first cycle; and
    determine condensation mass at each shell corresponding to the frost layer using the determined heat transfer rate at the interface; and
  a frost modeling tool to:
    iteratively estimate frost mass formed in the design component of a multi-component structure using the heat transfer rate at the interface between fluid and the frost layer inside the design component, a height of the frost layer and a density of the frost layer;
    determine a height and density at each shell corresponding to the frost layer based on the determined condensation mass, in the first cycle, wherein to determine the height and density at each shell corresponding to the frost layer, the frost modelling tool is configured to:
      compute a change in the initial height and initial density at each shell corresponding to the frost layer based on the determined condensation mass;
      compute a first height and a first density at each shell corresponding to the frost layer by adding the computed change to the initial height and initial density of the frost layer, respectively; and
      update the determined first height and first density at each shell corresponding to the frost layer based on a predetermined height of the frost layer; and
    estimate frost mass formed in the design component using the determined height and density at each shell corresponding to the frost layer, in the first cycle, wherein the component is designed to reduce the frost mass formed or removing the frost mass formed on the designed component based on the estimated frost mass, and wherein the design component is manufactured in accordance with the designing of the component.

15. The system of claim 14, wherein the frost modeling tool is configured to:
update the determined first height and first density at each shell corresponding to the frost layer to a second height and second density at each shell corresponding to the frost layer, respectively, when the first height is greater than the predetermined height, wherein the second height of the frost layer is less than the first height of the frost layer and the second density of the frost layer is greater than the first density of the frost layer.

16. The system of claim 14, wherein the predetermined height of the frost layer is based on geometrical constraints of the design component and wherein the geometrical constraints comprise a shortest distance to near wall from each shell corresponding to the frost layer, inlet parameters of the design component and/or outlet parameters of the design component.

17. The system of claim 9, wherein the multi-component structure comprises a vehicle or an air conditioning system and wherein the design component comprises ducts or bends with uniform or non-uniform cross-sectional areas.

18. A non-transitory computer-readable storage medium including instructions executable by a processor to:
iteratively estimate frost mass formed in a design component of a multi-component structure using a heat transfer rate at an interface between fluid and a frost layer in the design component, a height of the frost layer and a density of the frost layer, wherein iteratively estimating the frost mass formed in the design component comprises:
generating a volume mesh of the design component;
determining temperature at shells, in the volume mesh, that form the interface;
performing simulation using: the volume mesh, an initial height of the frost layer, an initial density of the frost layer, and the temperature at shells that form the interface, in order to determine the heat transfer rate at the interface, in a first cycle;
determining condensation mass at each shell corresponding to the frost layer using the determined heat transfer rate at the interface;
determining a height and density at each shell corresponding to the frost layer based on the determined condensation mass, in the first cycle, wherein determining the height and density at each shell corresponding to the frost layer based on the determined condensation mass, comprises:
computing a change in the initial height and initial density at each shell corresponding to the frost layer based on the determined condensation mass; and
determining a first height and a first density at each shell corresponding to the frost layer by adding the computed change to the initial height and initial density of the frost layer, respectively;
designing the component to reduce the frost mass formation or removing the frost mass formed on the designed component based on the determined height and density at each shell corresponding to the frost layer; and
manufacturing the design component in accordance with the designing of the component.

19. The non-transitory computer-readable storage medium of claim 18, wherein iteratively estimating the frost mass formed in the design component using the heat transfer rate at the interface, the height of the frost layer and the density of the frost layer, comprising:
estimating frost mass formed in the design component using the determined height and density at each shell corresponding to the frost layer, in the first cycle.

20. The non-transitory computer-readable storage medium of claim 19, further comprising:
determining temperature at the shells that form the interface using the determined height and density at each shell corresponding to the frost layer.

21. The non-transitory computer-readable storage medium of claim 20, further comprising:
repeat the steps of performing simulation, determining condensation mass, determining a height and density of the frost layer and estimating frost mass formed in the design component for a predefined number of cycles using the determined height and density of the frost layer and the temperature at the shells that form the interface.

22. A non-transitory computer-readable storage medium including instructions executable by a processor to:
iteratively estimate frost mass formed in a design component of a multi-component structure using a heat transfer rate at an interface between fluid and a frost layer in the design component, a height of the frost layer and a density of the frost layer, wherein iteratively estimating the frost mass formed in the design component comprises:
generating a volume mesh of the design component;
determining temperature at shells, in the volume mesh, that form the interface;
performing simulation using: the volume mesh, an initial height of the frost layer, an initial density of the frost layer, and the temperature at shells that form the interface, in order to determine the heat transfer rate at the interface, in a first cycle;
determining condensation mass at each shell corresponding to the frost layer using the determined heat transfer rate at the interface;
determining a height and density at each shell corresponding to the frost layer based on the determined condensation mass, in the first cycle, wherein determining the height and density at each shell corresponding to the frost layer based on the determined condensation mass, comprises:
computing a change in the initial height and initial density at each shell corresponding to the frost layer based on the determined condensation mass;
determining a first height and a first density at each shell corresponding to the frost layer by adding the computed change to the initial height and initial density of the frost layer, respectively; and
updating the determined first height and first density at each shell corresponding to the frost layer based on a predetermined height of the frost layer; and
estimating frost mass formed in the design component using the determined height and density at each shell corresponding to the frost layer, in the first cycle;
designing the component to reduce the frost mass formation or removing the frost mass formed on the designed component based on the estimated frost mass; and
manufacturing the design component in accordance with the designing of the component.

23. The non-transitory computer-readable storage medium of claim 22, wherein updating the determined first height and first density at each shell corresponding to the frost layer based on the predetermined height of the frost layer, comprises:
   updating the determined first height and first density at each shell corresponding to the frost layer to a second height and second density at each shell corresponding to the frost layer, respectively, when the first height is greater than the predetermined height, wherein the second height of the frost layer is less than the first height of the frost layer and the second density of the frost layer is greater than the first density of the frost layer.

24. The non-transitory computer-readable storage medium of claim 22, wherein the predetermined height of the frost layer is based on geometrical constraints of the design component and wherein the geometrical constraints comprise a shortest distance to near wall from each shell corresponding to the frost layer, inlet parameters of the design component and/or outlet parameters of the design component.

25. The non-transitory computer-readable storage medium of claim 18, wherein the multi-component structure comprises a vehicle or an air conditioning system and wherein the design component comprises ducts or bends with uniform or non-uniform cross-sectional areas.

* * * * *